US006521897B1

(12) United States Patent
Lindquist et al.

(10) Patent No.: US 6,521,897 B1
(45) Date of Patent: Feb. 18, 2003

(54) ION BEAM COLLIMATING GRID TO REDUCE ADDED DEFECTS

(75) Inventors: Walter B. Lindquist, Oakland, CA (US); Patrick A. Kearney, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 125 days.

(21) Appl. No.: 09/715,543

(22) Filed: Nov. 17, 2000

(51) Int. Cl.[7] .......................... C23C 14/00; C23C 14/32; H01J 27/00

(52) U.S. Cl. ............................... 250/423 F; 250/423 R; 204/192.12; 204/192.32; 204/192.34

(58) Field of Search ......................... 250/492.21, 396 R, 250/427, 423 R, 423 F, 492.3; 438/680, 674

(56) References Cited

U.S. PATENT DOCUMENTS

| | | | | | |
|---|---|---|---|---|---|
| 2,785,311 | A | * | 3/1957 | Lawrence | 250/426 |
| 3,410,774 | A | * | 11/1968 | Barson et al. | 204/192.32 |
| 4,119,881 | A | * | 10/1978 | Calderon | 204/192.34 |
| 4,523,971 | A | * | 6/1985 | Cuomo et al. | 118/50.1 |
| 4,538,067 | A | * | 8/1985 | Cuomo et al. | 250/396 R |
| 4,754,200 | A | * | 6/1988 | Plumb et al. | 315/111.81 |
| 4,847,504 | A | * | 7/1989 | Aitken | 250/492.21 |
| 5,003,178 | A | * | 3/1991 | Livesay | 250/423 F |
| 5,330,628 | A | * | 7/1994 | Demaray et al. | 204/192.12 |
| 5,344,352 | A | * | 9/1994 | Horne et al. | 204/192.15 |
| 5,643,428 | A | * | 7/1997 | Krivokapic et al. | 204/192.12 |
| 5,807,467 | A | * | 9/1998 | Givens et al. | 204/192.12 |
| 5,980,702 | A | * | 11/1999 | Parker | 204/192.12 |
| 6,036,821 | A | * | 3/2000 | Warren | 204/192.12 |

* cited by examiner

*Primary Examiner*—John R. Lee
*Assistant Examiner*—K. Fernandez
(74) *Attorney, Agent, or Firm*—L. E. Carnahan; Alan H. Thompson

(57) ABSTRACT

A collimating grid for an ion source located after the exit grid. The collimating grid collimates the ion beamlets and disallows beam spread and limits the beam divergence during transients and steady state operation. The additional exit or collimating grid prevents beam divergence during turn-on and turn-off and prevents ions from hitting the periphery of the target where there is re-deposited material or from missing the target and hitting the wall of the vessel where there is deposited material, thereby preventing defects from being deposited on a substrate to be coated. Thus, the addition of a collimating grid to an ion source ensures that the ion beam will hit and be confined to a specific target area.

7 Claims, 1 Drawing Sheet

ION BEAM COLLIMATING GRID TO REDUCE ADDED DEFECTS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to ion beam sources, particularly to an additional exit or collimating grid for an ion source, and more particularly to an addition grid which collimates ion beamlets and disallows beam spread and limits the beam divergence during transients and steady state operation.

The ion beam source used in an ion beam sputter deposition (ISBD) tool typically is focused and neutralized to ensure that the ion beam hits the center of the sputtering target during operation. The target is made large so that all the beam is intercepted. In practice, the ion beam during turn-on and turn-off becomes defocused and the ions hit the outer periphery of the target and may miss the target completely. During the coating cycle of substrates, particularly involving multilayer coatings, there is re-deposited material on the periphery of the target and deposited materials on the walls of the deposition chamber. Ions that hit the re-deposited material and/or hit the material deposited on the vessel walls may dislodge particulates which can become defects on the substrate being coating. Thus, there is a need for preventing defects on the substrate from either the re-deposited target material or the material deposited on the walls of the deposit ion chamber. Defects on substrates, such as used for masks in lithographic applications, produce a major problem.

The present invention provides a solution to the above defect problem by providing the ion source with an additional exit or collimating grid that ensures that the ion beam will hit and be confined to a specific target area, thereby collimating the ion beamlets and disallowing beam spread during turn-on and turn-off of the ion beam. Thus, the collimating grid prevents ions from hitting the peripheral re-deposited target material and/or from hitting material deposited on the walls of the deposition chamber.

SUMMARY OF THE INVENTION

It is an object of the present invention to provide an improved ion beam source.

A further object of the invention is to provide an ion beam collimating grid to reduce deposition defects.

A further object of the invention is to provide an ion source with means which disallows beam spread and limits the beam divergence during turn-on and turn-off.

Another object of the invention is to add to the ion source grid set an extra exit grid.

Another object of the invention is to provide an ion beam source with an additional exit grid which collimates the ion beamlets, and disallows beam spread, and limits the beam divergence during transients and steady state operation.

Another object of the invention is to provide an ion beam source with a collimating exit grid which prevents the ion beam from hitting the periphery of the target or hitting material deposited on the walls of a deposit chamber.

Another object of the invention is to provide an ion source for deposition applications where minimization of defects on the substrate being coated is critical, such for defect free masks for extreme ultraviolet lithography (EUVL).

Other objects and advantages of the present invention will become apparent from the following description and accompanying drawings. Basically, the invention involves the addition of an extra exit or collimating grid to an ion source grid set. Thus, in addition to the typical ion source grid set comprising an entrance grid, a suppressor grid, an exit grid, the present invention adds a collimating grid spaced downstream beamwise from the exit grid. The collimating or added exit grid collimates the ion beamlets, disallows beam spread, and limits beam divergence. Thus, during turn-on, turn-off, or other transient, as well as steady operations, the added grid prevents ions of the ion beam from hitting the periphery of the target or missing the target and hitting the wall of the deposition chamber. Thus, particles, resulting in defects on the substrate being coated, which are caused by ions hitting re-deposited material on the periphery of the target or deposited material on the walls of its deposition chamber are eliminated. Thus, by the use of the collimating grid, defect free masks, for example, as required for EUVL systems, or other applications where minimization of particulates on the substrate being coated is important, can be produced.

DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

Figure 2:
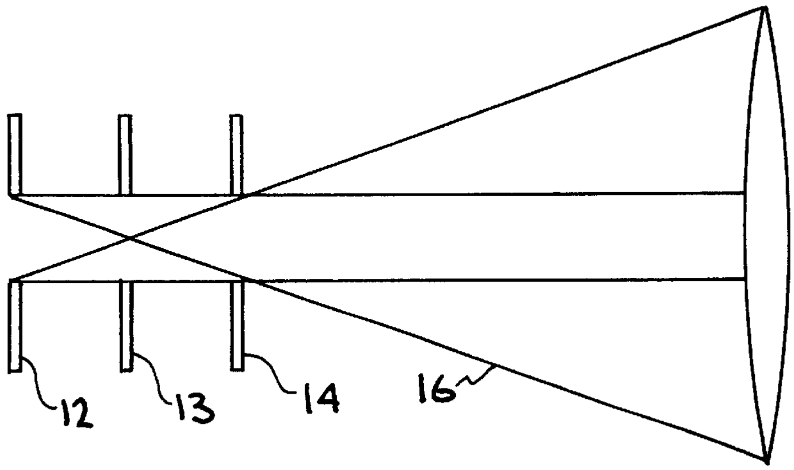
FIG. 2 schematically illustrates the configuration of a beamlet from an ion source without the collimating grid.
Figure 3:
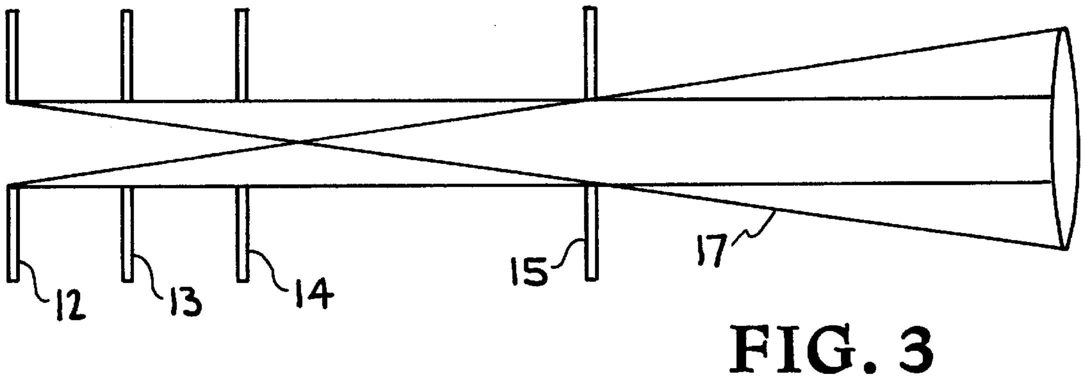
FIG. 3 schematically illustrates the configuration of a beamlet produced by the FIG. 1 ion source with the collimating grid.

The present invention involves an ion source which incorporates an extra collimating grid located after (downstream beamwise) the conventional exit grid. Given the correct hole size and distance from the exit grid the collimator grid limits the divergence of the ion beam as seen in FIG. 3, compared to the divergence of an ion beam without the collimating grid as seen in FIG. 2. By employing a mechanical baffle, not shown, the spread of the beam is limited for all operating conditions. As pointed out above, without the collimator grid the beam divergence varies during turn-on and turn-off and ions from the beam hit the outside or periphery of the target where there is re-deposited material, and the ions may be even miss the target completely and hit deposited material on the wall of the deposition chamber, causing material to dislodge which form particulates that may end up on the substrate, thereby forming defects in the coating being deposited on the substrate. In applications where minimization of particulates on the substrate are important, and particularly where defect free substrates are required, such as the masks for EUVL system, the present invention provides a solution to the defect problem.

By the addition of a collimator grid to the grid set of an ion beam source, as provided by this invention, the grid collimates the ion beamlets and disallows beam spread and limits the beam divergence during transients and steady state operations. The ion source used for ion beam sputter deposition (IBSD), in which the collimator grid has been incorporated is a relatively low power ion source, ≈800 eV and ≈300 mA (240 watts). The collimating grid will intercept a few watts of beam power during steady state operation. During transients the intercepted beam power will be greater but the duration will be short and the heating low. Typically the collimating grid will only require cooling if the other ion source grids require cooling. Such ion sources that require grid cooling produce 10's of amperes at 10's of kilovolts. The new collimating grid offers a simple and practical way of insuring the ion beam has a finite diameter under all operating conditions. The use of a collimating grid has the distinct advantage of ensuring that the ion beam will hit and be confined to a specific target area.

Figure 1:
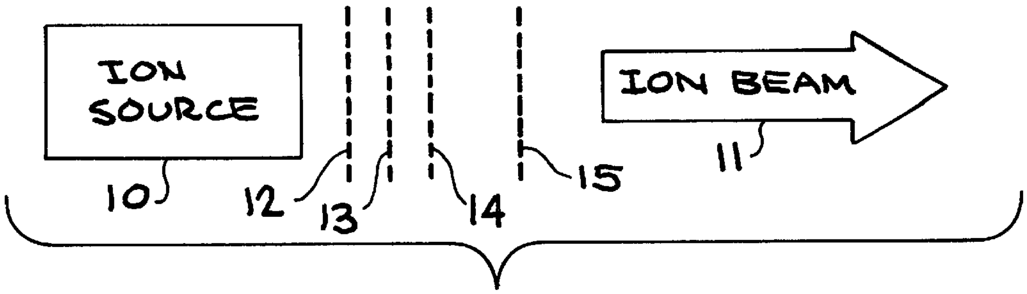
FIG. 1 schematically illustrates an ion source which incorporates a collimating grid in accordance with the present invention.

Referring now to drawings, FIG. 1 schematically illustrates an ion source for producing an ion beam which incorporates a collimating grid positioned in space downstream (beamwise) from the exit grid of the grid set of the ion source. The ion source, generally indicated at 10 produces an ion beam 11, and includes an entrance grid 12, a suppression grid 13, and exit grid 14, and a collimating grid 15. The collimating grid 15 is located a distance of a few centimeters (1–3 cm) downstream from the exit grid 14. The entrance grid 12 and the suppressor grid 13 are operatively connected to a power source and the exit grid 14 is grounded, as conventionally known in the art. The collimating grid 15 is connected to the exit grid. The ion beam source operates in a power range of about 100 watts to about 1000 watts.

FIG. 2 illustrates a typical beamlet divergent configuration utilizing only the grids 12–14 of the FIG. 1 ion source, the beamlet being indicated at 16. FIG. 3 illustrates the beamlet divergent configuration utilizing the collimating grid 15 of FIG. 1, the beamlet being indicated at 17. It is readily seen by a comparison of beamlets 16 and 17 that the collimating grid collimates the ion beamlets, disallows beam spread, and limits the beam divergence during transients and steady state operation.

It has thus been shown that the present invention has provided an improved ion beam source by providing an extra exit grid which functions to reduce added defects on a substrate being coated by ion beam deposition which are created by ions hitting re-deposited target material located at the periphery of the target or by hitting material deposited on the walls of the deposition chamber. The invention has applications where minimization of particulates on the substrate being coated is important, and is particularly applicable in EUVL where defect free masks are required. By collimating the ion beamlets, disallowing beam spread and limiting the beam divergence during transients and steady state operations, the collimating grid ensures that the ion beam will hit and be confined to a specific target area, thereby eliminating potential defect problems on the substrate being coated.

While a particular grid arrangement has been illustrated and described, with particular parameters set forth to exemplify and teach the principles of the invention, such are not intended to be limiting. Modifications and changes may become apparent to those skilled in the art, and it is intended that the invention be limited only by the scope of the appended claims.

What is claimed is:

1. In an ion beam source, the improvement comprising:

a collimating grid which insures that ions of the ion beam hit and are confined to a specific target area, said collimating grid being position in spaced relationship to an exit grid of said ion source, said collimating grid and said exit grid being at the same potential, and said collimating grid being constructed and located with respect to said exit grid to collimate ion beamlets, disallow beam spread, and limit beam divergence during transients and steady state operation.

2. The improvement of claim 1, wherein said collimating grid operates without external cooling in ion beam sources having a power in the range of 100 to 1000 watts.

3. An ion beam source having a set of grids comprising:

an entrance grid, a suppressor grid, an exit grid, and a collimating grid located downstream beamwise from and spaced from said exit grid, said collimating grid being connected to said exit grid, and said collimating grid being constructed and located to collimate ion beamlets, disallow beam spread, and limit beam divergence during transients and steady state operation.

4. The ion beam source of claim 3, having a power in the range of about 100 watts to about 1000 watts.

5. A method of reducing defects caused by ions of an ion beam source hitting re-deposited target material or material deposited on a wall of a deposition chamber, comprising:

providing a collimating grid downstream from an exit grid of an ion beam source, and positioning the collimating grid with respect to the exit grid so as to collimate ion beamlets from the ion source onto a specific area of a target, connecting the collimating grid to the exit grid so as to be at the same potential, and constructing and positioning the collimating grid so as to collimate ion beamlets, disallow beam spread, and limit the beam divergences during transient operation and during steady state operation.

6. The method of claim 5, wherein the collimating grid is positioned in a low power source having operating in a power range of 100 to 1000 watts.

7. The method of claim 5, wherein positioning the collimating beam is carried out at a distance of 1 to 3 cm from the exit grid of the ion beam source.

* * * * *